United States Patent
Hong et al.

(10) Patent No.: US 7,911,043 B2
(45) Date of Patent: Mar. 22, 2011

(54) WAFER LEVEL DEVICE PACKAGE WITH SEALING LINE HAVING ELECTROCONDUCTIVE PATTERN AND METHOD OF PACKAGING THE SAME

(75) Inventors: Ju Pyo Hong, Gyunggi-do (KR); Seog Moon Choi, Seoul (KR); Tae Hoon Kim, Gyunggi-do (KR); Job Ha, Gyunggi-do (KR); Seung Wook Park, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 335 days.

(21) Appl. No.: 12/153,705

(22) Filed: May 22, 2008

(65) Prior Publication Data

US 2008/0290479 A1 Nov. 27, 2008

(30) Foreign Application Priority Data

May 22, 2007 (KR) .................. 10-2007-0049834

(51) Int. Cl.
*H01L 23/02* (2006.01)
(52) U.S. Cl. .......... 257/678; 257/E23.061; 257/E33.056
(58) Field of Classification Search .................. 257/666, 257/777, 778, E21.51, E23.031, 678, 730, 257/E33.056, E23.001, E23.061; 438/111, 438/106, 113
See application file for complete search history.

(56) References Cited

U.S. PATENT DOCUMENTS

| 5,608,264 | A | * | 3/1997 | Gaul ............................. 257/734 |
| 6,452,238 | B1 | * | 9/2002 | Orcutt et al. .................. 257/415 |
| 6,972,480 | B2 | | 12/2005 | Zilber et al. |
| 2003/0068847 | A1 | * | 4/2003 | Watanabe et al. ............ 438/200 |
| 2003/0230798 | A1 | * | 12/2003 | Lin et al. ....................... 257/704 |
| 2004/0087043 | A1 | * | 5/2004 | Lee et al. .......................... 438/6 |

FOREIGN PATENT DOCUMENTS

JP 2006-69312 3/2006

* cited by examiner

*Primary Examiner* — Thomas L Dickey
*Assistant Examiner* — Nikolay Yushin

(57) ABSTRACT

Provided are wafer level package with a sealing line that seals a device and includes electroconductive patterns as an electrical connection structure for the device, and a method of packaging the same. In the wafer level package, a device substrate includes a device region, where a device is mounted, on the top surface. A sealing line includes a plurality of non-electroconductive patterns and a plurality of electroconductive patterns, and seals the device region. A cap substrate includes a plurality of vias respectively connected to the electroconductive patterns and is attached to the device substrate by the sealing line. Therefore, a simplified wafer level package structure that accomplishes electric connection through electroconductive patterns of a sealing line can be formed without providing an electrode pad for electric connection with a device.

16 Claims, 5 Drawing Sheets

WAFER LEVEL DEVICE PACKAGE WITH SEALING LINE HAVING ELECTROCONDUCTIVE PATTERN AND METHOD OF PACKAGING THE SAME

CROSS-REFERENCE TO RELATED APPLICATIONS

This application claims the priority of Korean Patent Application No. 2007-0049834 filed on May 22, 2007, in the Korean Intellectual Property Office, the disclosure of which is incorporated herein by reference.

BACKGROUND OF THE INVENTION

1. Field of the Invention

The present invention relates to a wafer level device package and a method of packaging the same, and more particularly, to a wafer level device package with a sealing line having an electroconductive pattern and a method of packaging the same that can seal a device and simultaneously have an electrical connection structure for the device.

2. Description of the Related Art

Recently, as semiconductor devices shrink in size, interest in wafer level package technology is rapidly growing. A wafer level package technology refers to a semiconductor package technology that packages chips at a wafer level where the chips are not cut or separated, as opposing to an existing technology that cuts a wafer into individual chips and packages them.

Specifically, a semiconductor package is fabricated through four steps: circuit design, wafer processing, assembly, and inspection. The assembly process includes a wire bonding process and a packaging process. The assembly process includes cutting a process-finished wafer into individual chips, attaching the individual chips on a small circuit board, bonding wires, and sealing the chips with a plastic package.

The wafer level packaging is accomplished by a simple procedure. That is, instead of plastic that has been used as a package material, a photosensitive insulation material is coated over the individual chips disposed on the wafer, wires are bonded, and an insulation material is again coated thereon.

Such a wafer level package technology can reduce the semiconductor assembly processes, such as the wire bonding and plastic package. Furthermore, a manufacturing cost can be remarkably reduced because the plastic, the circuit board, and the wires, which have been used for the semiconductor assembly, are not needed. In particular, since the wafer level package technology can fabricate the package with the same size as the chip, the package size can be reduced by more than about 20 percents compared with a typical chip scale package (CSP) that has been applied to the shrinkage of the semiconductor package.

As illustrated in FIG. 1, a wafer level package includes a first substrate 1 defining a device active region 4 where a lot of devices are formed. The first substrate 1 is provided for device fabrication. A second substrate 2 is attached to the first substrate 1 through support walls 3 and supported by the support walls 3. The second substrate 2 is provided for capping the device active region 4 in order to protect it. An electrode 5 for an external wire is packaged in such a state that it is arranged on the first substrate 1, without protruding over the silicon substrate 2.

Therefore, the reliability is reduced in sealing of the device active region 4. In addition, manufacturing processes become complicated and the manufacturing cost increases, because an electrode pad is needed for electrical connection.

SUMMARY OF THE INVENTION

An aspect of the present invention provides a wafer level device package with a sealing line having an electroconductive pattern so as to seal a device and simultaneously have an electrical connection structure for the device.

An aspect of the present invention also provides a method of packaging a wafer level device package with a sealing line having an electroconductive pattern so as to seal a device and simultaneously have an electrical connection structure for the device.

According to an aspect of the present invention, there is provided a wafer level package, including: a device substrate comprising a device region, where a device is mounted, on the top surface; a sealing line comprising a plurality of non-electroconductive patterns and a plurality of electroconductive patterns and sealing the device region; and a cap substrate comprising a plurality of vias respectively connected to the electroconductive patterns and being attached to the device substrate by the sealing line.

According to another aspect of the present invention, there is provided a method of packaging a wafer level device, the method including: forming a device and a plurality of connecting patterns electrically connected to the device on a top surface of a first wafer for a device substrate; forming a sealing line that comprises a plurality of electroconductive patterns connected to the connecting patterns and a plurality of non-electroconductive patterns and surrounds the device region; attaching a second wafer for a cap substrate to the first wafer by the sealing line; forming a plurality of vias respectively connected to the electroconductive patterns of the sealing line in the second wafer; and a performing a dicing process along the sealing line so as to separate wafer level packages sealing the device.

The electroconductive patterns may have a larger area than the non-electroconductive patterns of the sealing line.

Each of the vias may penetrate the cap substrate to be connected to one portion of each of the electroconductive patterns.

The non-electroconductive patterns may be formed of one selected from benzocyclobutene (BCB), dry film resin (DFR), epoxy, and thermosetting polymer.

The electroconductive patterns may be formed of metal or electroconductive paste.

In the forming of the sealing line, the non-electroconductive patterns may be formed of one selected from benzocyclobutene (BCB), dry film resin (DFR), epoxy, and thermosetting polymer using screen printing or injection through a nozzle.

In the forming of the sealing line, the electroconductive patterns may be formed of electroconductive paste using screen printing or injection through a nozzle.

In the forming of the sealing line, the electroconductive patterns may be formed of metal using physical vapor deposition (PVD).

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
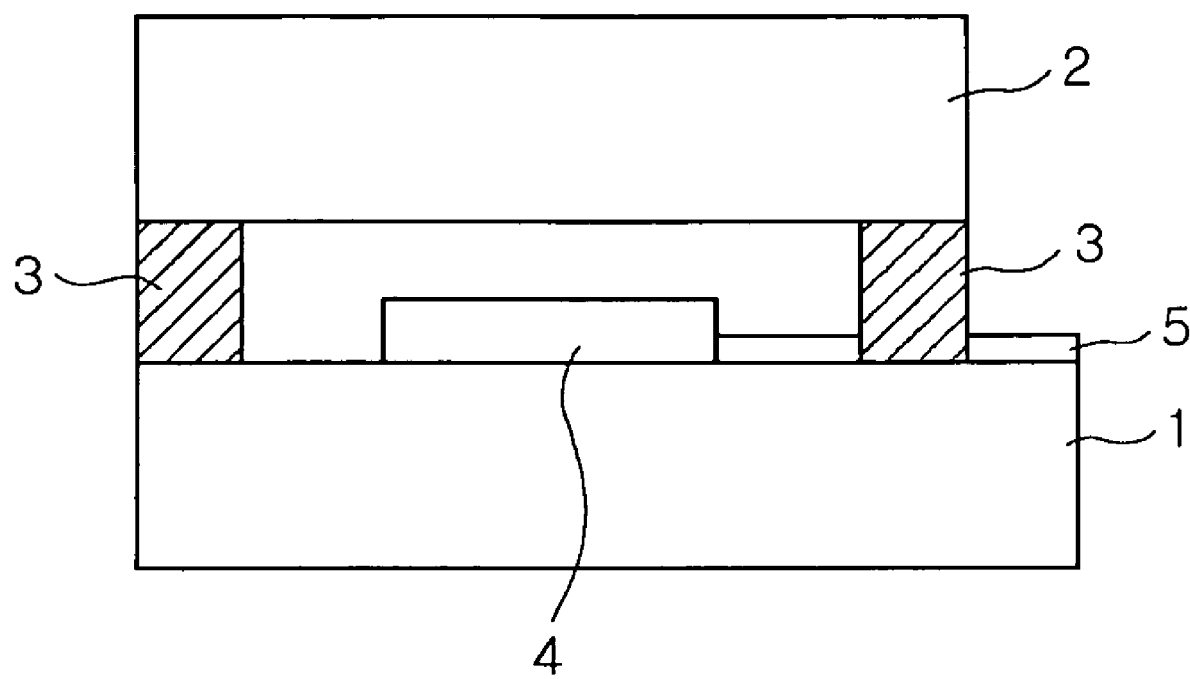
FIG. 1 is a cross-sectional view illustrating a wafer level package according to the related art.
Figure 2A:
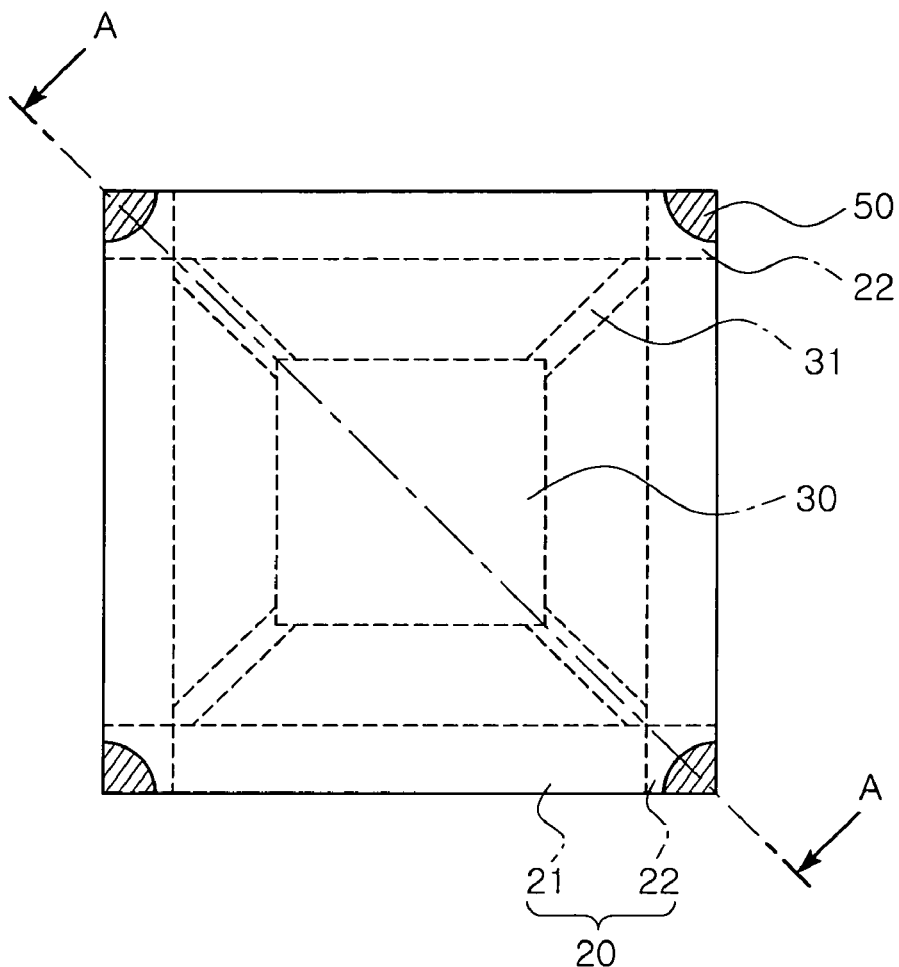
FIG. 2A is a top perspective view of a wafer level device package with a sealing line having an electroconductive pattern according to an embodiment of the present invention.
Figure 2B:
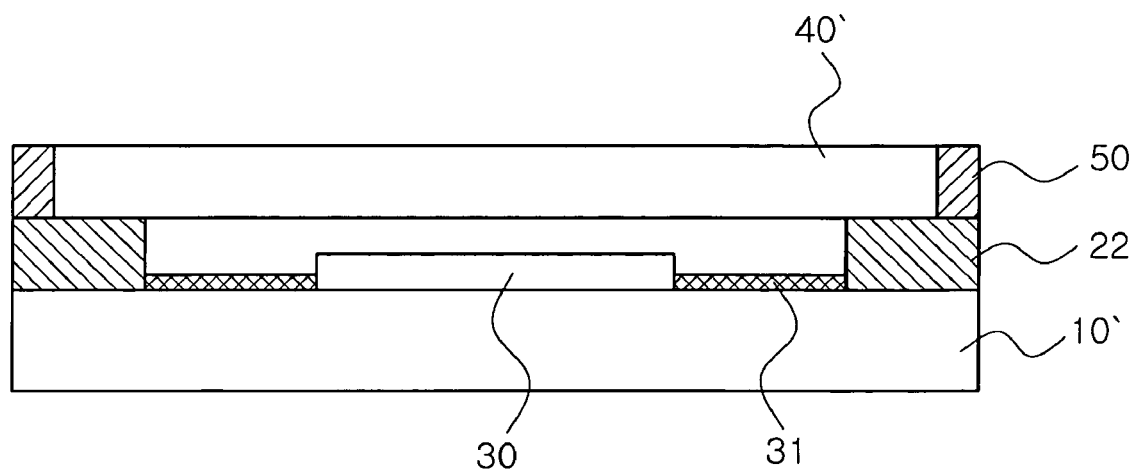
FIG. 2B is a cross-sectional view of the wafer level device package taken along a line A-A of FIG. 2A.

FIG. 2A is a top perspective view of a wafer level device package with a sealing line having an electroconductive pattern according to an embodiment of the present invention, FIG. 2B is a cross-sectional view of the wafer level device package taken along a line A-A of FIG. 2A, and FIGS. 3A through 3E are cross-sectional views illustrating a method of packaging a wafer level device package with a sealing line having an electroconductive pattern according to an embodiment of the present invention.

Referring to FIGS. 2A and 2B, the wafer level device package with a sealing line having an electroconductive pattern includes a device substrate 10', a cap substrate 40', a sealing line 20 including an electroconductive pattern 22, and a via 50. A device region 30 including a device is disposed on a top surface of the device substrate 10'. The sealing line 20 attaches the device substrate 10' to the cap substrate 40' and seals the device region 30. The via 50 penetrates the cap substrate 40' to be electrically connected to the electroconductive pattern 22.

The device substrate 10' includes the device region 30 and a plurality of lead frames 31. A device that should be sealed is disposed in the device region 30. Examples of the device include a surface acoustic wave (SAW) filter having an interdigital transducer (IDT) electrode, a micro electro mechanical systems (MEMS) device, and so on. The lead frames 31 are electrically connected to the device of the device region 30.

Referring to FIG. 2A, the sealing line 20 includes a plurality of a non-electroconductive patterns 21 and the electroconductive patterns 22, and has a rectangular shape of a closed-curve so as to surround the device of the device region 30. Here, the non-electroconductive patterns 21 may be formed of polymer such as benzocyclobutene (BCB), dry film resin (DFR), epoxy, or thermosetting polymer through screen printing or injection using a nozzle. The electroconductive patterns 22 may be formed of electroconductive material such as metal, electroconductive paste, or the like and may be connected to the lead frames 31 at a corner of the sealing line 20 between the non-electroconductive patterns 21.

The cap substrate 40' is attached to the device substrate 10' by the sealing line 20 and includes the plurality of vias 50 that are respectively connected to the electroconductive patterns 22 of the sealing line 20. Therefore, an electrical signal can be transferred from the device of the device region 30 or a voltage can be applied to the device of the device region 30 through the lead frames 31 that are electrically connected to the electroconductive patterns 22.

In the wafer level package according to the embodiment of the present invention, the device region 30 including the devices is sealed using the sealing line 20 including the plurality of non-electroconductive patterns 21 and the plurality of electroconductive patterns 22, and electrical connection is accomplished through the electroconductive patterns 22 of the sealing line 20. Therefore, an electrode pad used for the related art is not needed, thereby simplifying the package structure.

A method of packaging a wafer level package according to an embodiment of the present invention will be described below with reference to FIGS. 3A through 3D.

Figure 3A:
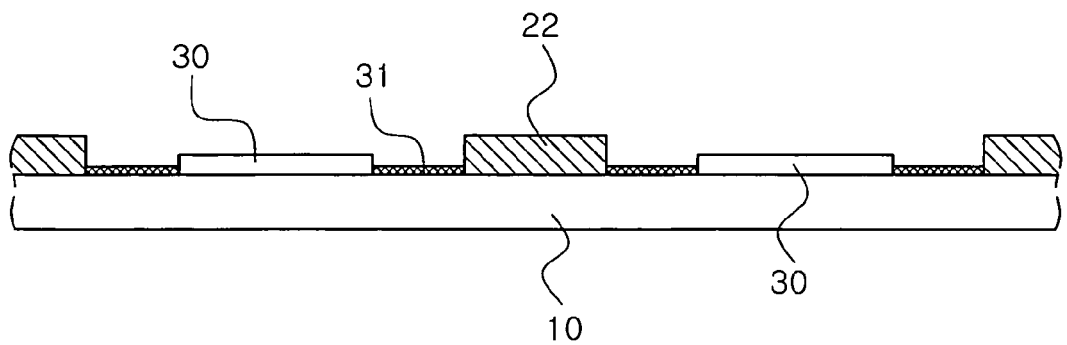
FIGS. 3A through 3D are cross-sectional views illustrating a method of packaging a wafer level device package with a sealing line having an electroconductive pattern according to an embodiment of the present invention.

Referring to FIG. 3A, a first wafer 10 for a device substrate is prepared. The first wafer 10 includes a device region 30 and a plurality of lead frames 31 on a top surface thereof. The plurality of lead frames 31 are electrically connected to device of the device region 30. A sealing line 20 including electroconductive patterns 22 connected to the lead frames 31 and non-electroconductive patterns 21 is formed so as to surround the device region 30. Here, the device of the device region 30, which is provided on the top surface of the first wafer 10, need to be sealed. For example, the device may be a surface acoustic wave (SAW) filter having an interdigital transducer (IDT) electrode, a micro electro mechanical systems (MEMS) device, or the like. The SWA filter of the device region 30 is electrically connected to the plurality of lead frames 31.

Specifically, as illustrated in FIG. 2A, in order to form the sealing line 20, which includes the plurality of non-electroconductive patterns 21 and electroconductive patterns 22, into a rectangular shape of a closed-curve so as to surround the device of the device region 30, the non-electroconductive patterns 21 that surround the device region 30 is formed of polymer such as benzocyclobutene (BCB), dry film resin (DFR), epoxy, thermosetting polymer through screen printing or injection using a nozzle.

Next, the electroconductive patterns 22 are formed of electroconductive paste such as solder paste or metal between the non-electroconductive patterns 21, that is, at portions connected to the plurality of lead frames 31 through screen printing, injection using a nozzle, or physical vapor deposition (PVD). Of course, the sealing line 20 may be formed by forming the plurality of non-electroconductive patterns 21 and the plurality of electroconductive patterns 22 at the same time.

Figure 3B:
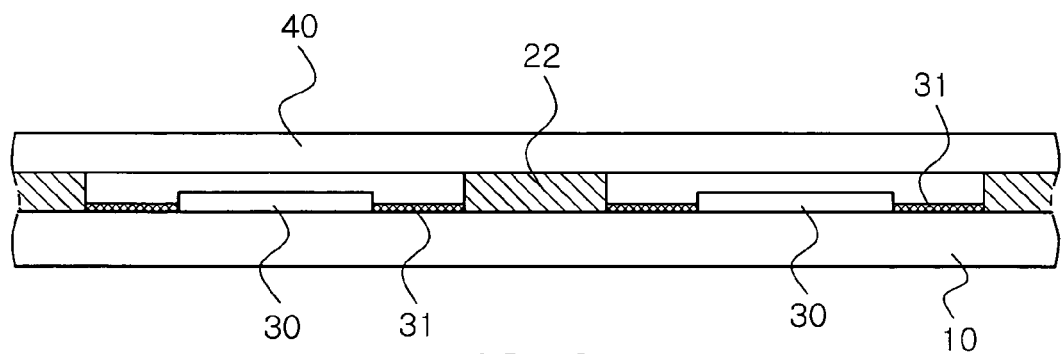

After the sealing line 20 including the non-electroconductive patterns 21 and the electroconductive patterns 22 are formed into a rectangular shape of a closed-curve so as to surround the device of the device region 30, as illustrated in FIG. 3B, a second wafer 40 for a cap substrate is attached to the first wafer 10 by the sealing line 20.

The second wafer 40 is attached to the first wafer 10 using the sealing line 20 using the non-electroconductive patterns 21 formed of polymer that is melted at 80° C. to 250° C., thereby preventing thermal deformation and damage of the first wafer 10 and the second wafer 40 caused by temperature.

Figure 3C:
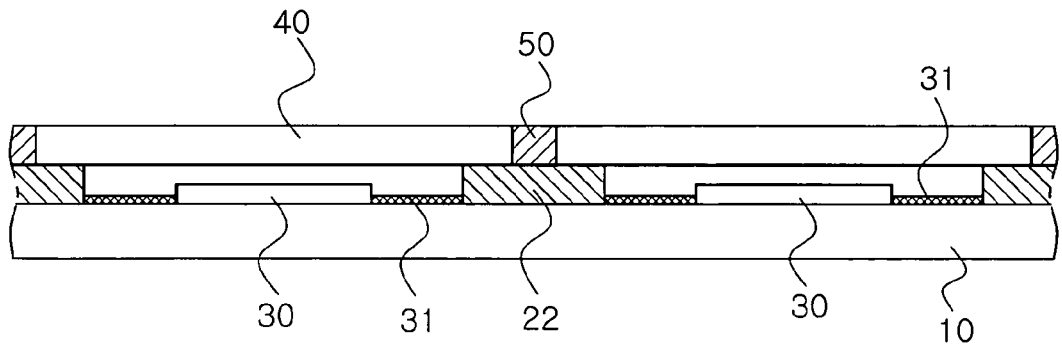

After the second wafer 40 is attached to the first wafer 10 by the sealing line 20, as illustrated in FIG. 3C, a photoresist pattern (not shown) is formed through patterning so as to expose a portion of the second wafer 40, which is in contact with the electroconductive patterns 22. An etch process is performed using the photoresist pattern to form via holes. Next, the via holes are filled process with metal or electroconductive paste using a physical vapor deposition (PVD) process or a screen printing process so as to form vias 50. Alternatively, a plurality of via holes may be formed in the second wafer 40 through punching, before the attachment of the first wafer 10 and the second wafer 40.

After the vias 50 are formed by filling the via holes with metal or electroconductive paste using the PVD process or the screen printing process, a chemical mechanical polishing (CMP) process is performed so as to planarize the second wafer 40 and the vias 50 and reduce an entire thickness thereof.

Figure 3D:
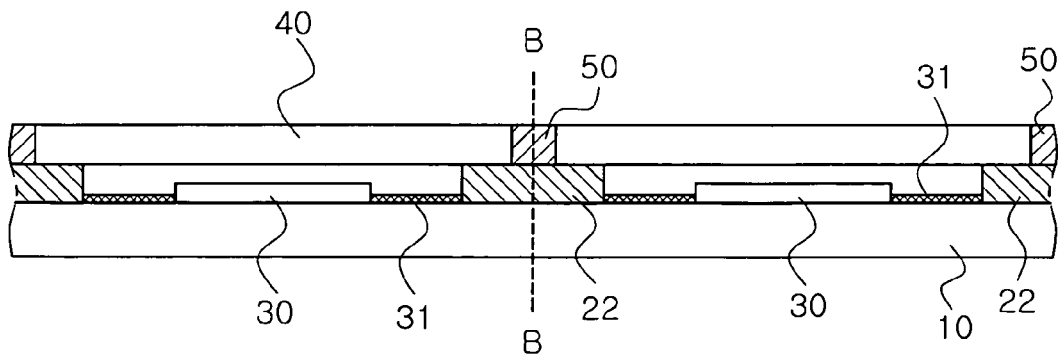

After planarizing the second wafer 40 and the vias 50, as illustrated in FIG. 3D, a dicing process is performed to cut along a scribe line B for each via 50 so as to divide the device into packages where the device of the device region 30 is sealed.

Figure 4:
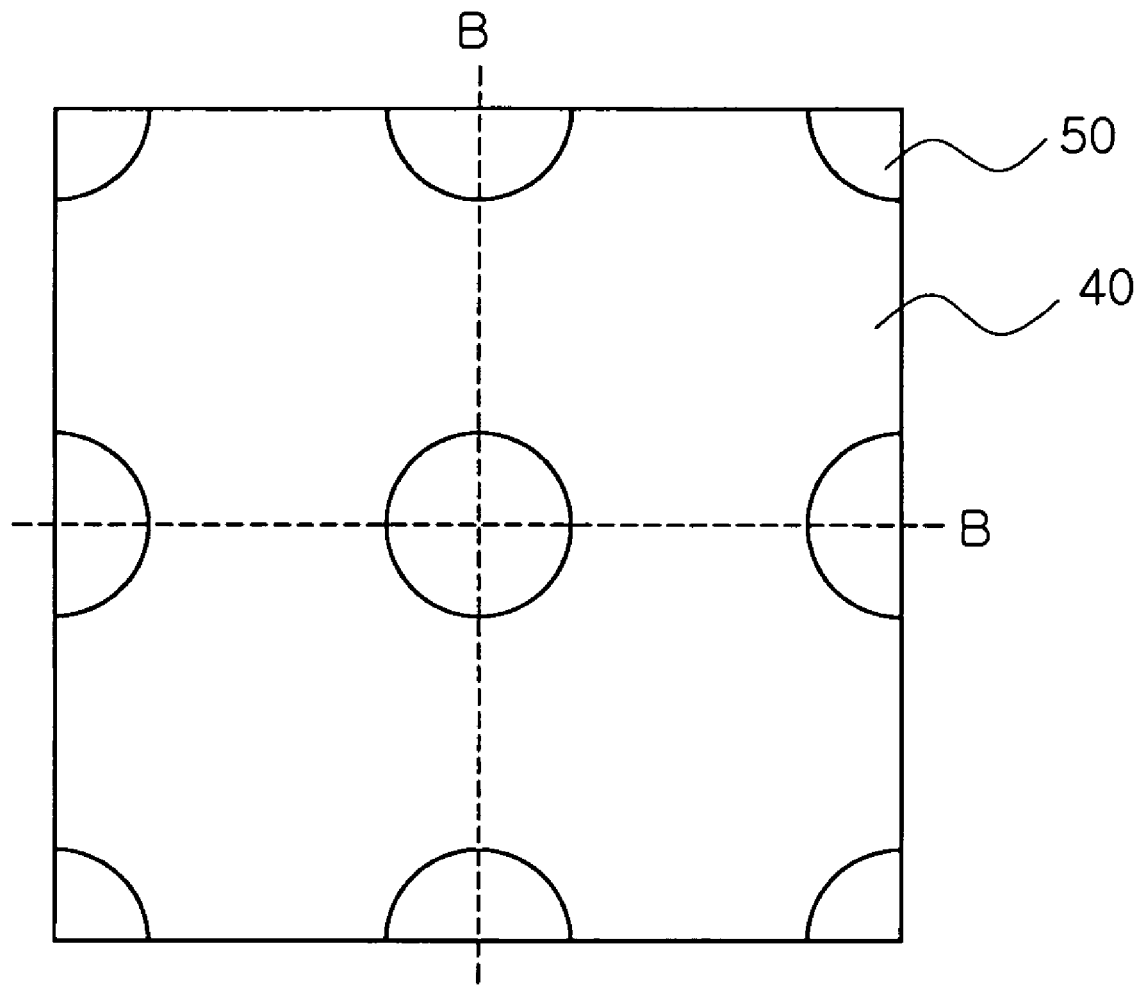
FIG. 4 is a view illustrating a dicing process of a method of packaging a wafer level device package with a sealing line having an electroconductive pattern according to an embodiment of the present invention.

Here, referring to FIG. 4, the scribe line B for the dicing process is formed in an x direction and a y direction on a top surface of each via 50. Accordingly, as illustrate in FIG. 2A, each via 50 has a fan shape and is connected to each of the electroconductive patterns 22 at a corner of the sealing line 20.

Therefore, an electrical signal can be transferred from the device of the device region 30 or a voltage can be applied to the device of the device region 30 through the electroconductive patterns 22 connected to the via 50 and the lead frames 31, thereby simplifying the wafer level packaging method without an electrode pad used for the related art.

A wafer level device package with a sealing line 200 including electroconductive patterns 220 according to another embodiment of the present invention will be described below with reference to FIGS. 5A and 5B. Since the wafer level device package according to the present embodiment is the same as the wafer level device package according to the embodiment of FIGS. 2A and 2B except the shape of the sealing line 200, detailed description will be omitted herein.

Figure 5A:
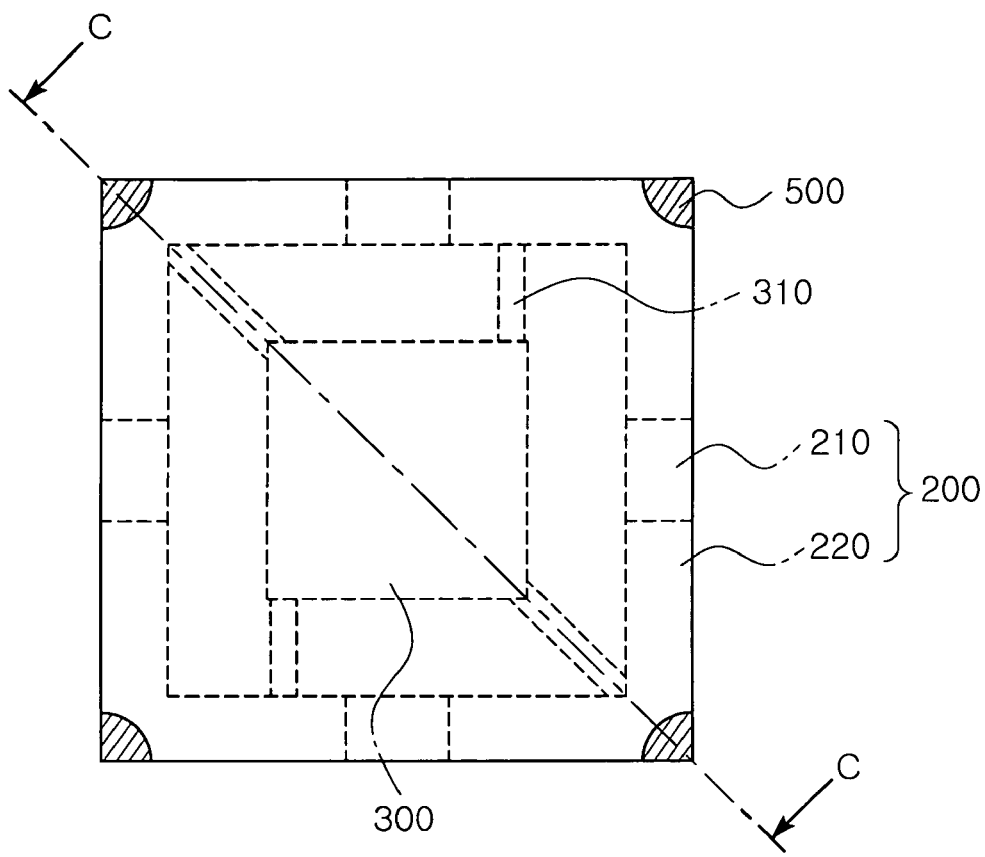
FIG. 5A is a top perspective view of a wafer level device package with a sealing line having an electroconductive pattern according to another embodiment of the present invention.
Figure 5B:
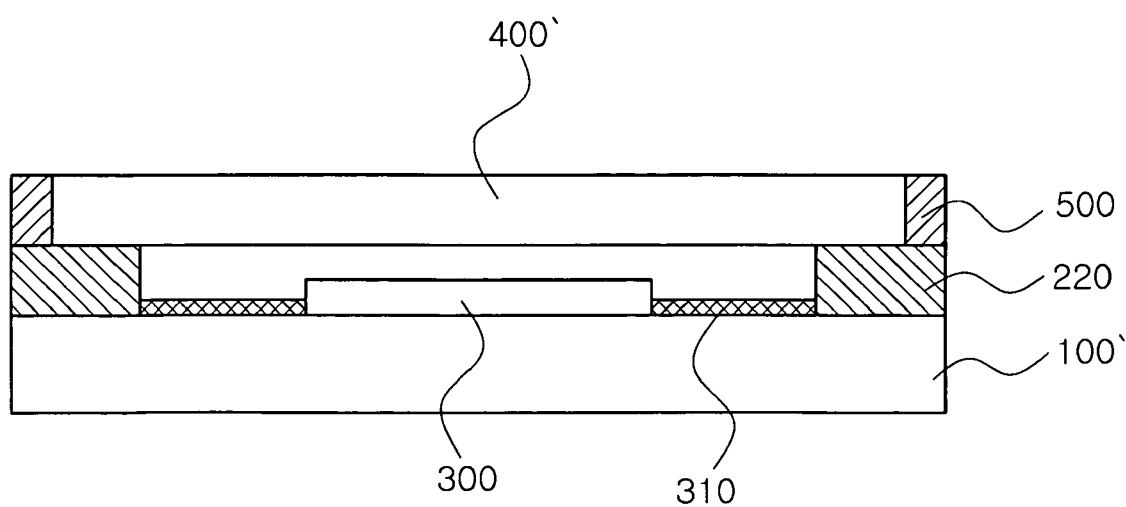
FIG. 5B is a cross-sectional view of the wafer level device package taken along a line C-C of FIG. 5A.

FIG. 5A is a top perspective view of a wafer level device package with a sealing line having electroconductive patterns according to another embodiment of the present invention, and FIG. 5B is a cross-sectional view of the wafer level device package taken along a line C-C of FIG. 5A.

Referring to FIGS. 5A and 5B, the wafer level device package according to another embodiment of the present invention includes a device substrate 100', a sealing line 200, and a cap substrate 400'. A device region 300 including a device is disposed on a top surface of the device substrate 100. The sealing line 200 includes non-electroconductive patterns 210 and electroconductive patterns 220 having a larger area than the non-electroconductive patterns 210 and seals the device region 300. The cap substrate 400' includes vias 500 electrically connected to the electroconductive patterns 220.

The device substrate 100' includes the device region 300 and a plurality of lead frames 310 on a top surface thereof. A device that should be sealed is formed in the device region 300. Examples of the device includes a SAW filter having an IDT electrode, a MEMS device, and so on. The lead frames 310 are electrically connected to the device of the device region 300.

Referring to FIG. 5A, the sealing line 200 includes the plurality of non-electroconductive patterns 210 and electroconductive patterns 220 and has a rectangular shape of a closed curve so as to surround the device of the device region 300.

Here, the electroconductive patterns 220 may be formed of an electroconductive material such as metal and electroconductive paste through screen printing, injection using a nozzle, or physical vapor deposition (PVD). The non-electroconductive patterns 210 may be formed of polymer such as benzocyclobutene (BCB), dry film resin (DFR), epoxy, or thermosetting polymer through screen printing or injection using a nozzle.

Since the electroconductive patterns 220 of the sealing line 200 have a larger area than the non-electroconductive patterns 210, the lead frames 310 can be easily connected to the electroconductive patterns 220, thereby improving the degree of freedom for design.

The cap substrate 400' is attached to the device substrate 100' by the sealing line 200, and the plurality of vias 500 of the cap substrate 400' are respectively connected to portions of the electroconductive pattern 220 of the sealing line 200. Therefore, an electrical signal can be transferred from the device of the device region 300 or a voltage can be applied to the device of the device region 300 through the lead frames 310 electrically connected to the electroconductive patterns 220.

In the wafer level package of another embodiment of the present invention, the device region 300 including the device can be sealed by the sealing line 200 including the non-electroconductive patterns 210 and the electroconductive patterns 220. In addition, electrical connection with the device of the device region 300 can be accomplished through the lead frames 310, which are easily connected to the electroconductive patterns 220 having a larger area than the non-electroconductive patterns 210 of the sealing line 200.

Accordingly, the wafer level package structure can be simplified by having the electrical connection structure through the electroconductive patterns 220 of the sealing line 200 without providing an electrode pad for electrical connection of a device.

According to a simplified wafer level package structure of the present invention, electrical connection can be accomplished through electroconductive patterns of a sealing line without providing an electrode pad for electrical connection of a device.

In addition, according to a simplified method of packaging a wafer level package of the present invention, an electrical signal can be transferred from a device of a device region or a voltage can be applied to the device of the device region through electroconductive patterns of a sealing line connected to vias and lead frames without a process including an electrode pad.

While the present invention has been shown and described in connection with the exemplary embodiments, it will be apparent to those skilled in the art that modifications and variations can be made without departing from the spirit and scope of the invention as defined by the appended claims.

What is claimed is:

1. A wafer level package comprising:
    a device substrate comprising a device region, where a device is mounted, on a top surface of the device substrate;
    a sealing line comprising a plurality of non-electroconductive patterns and a plurality of electroconductive patterns and forming a side wall to seal the device region; and
    a cap substrate comprising a plurality of vias respectively connected to the electroconductive patterns and being attached to a top surface of the sealing line.

2. The wafer level package of claim 1, further comprising a plurality of lead frames disposed on the top surface of the device substrate and connected between the device and the electroconductive patterns of the sealing line.

3. The wafer level package of claim 2, wherein the lead frames do not penetrate the sealing line.

4. The wafer level package of claim 1, wherein an area of the electroconductive patterns is larger than an area of the non-electroconductive patterns.

5. The wafer level package of claim 4, wherein each of the vias penetrates the cap substrate to be connected to one portion of each of the electroconductive patterns.

6. The wafer level package of claim 1, wherein the non-electroconductive patterns are formed of benzocyclobutene (BCB), dry film resin (DFR), epoxy, or thermosetting polymer.

7. The wafer level package of claim 1, wherein the electroconductive patterns are formed of metal or electroconductive paste.

8. A method of packaging a wafer level device, the method comprising:
forming a device and a plurality of connecting patterns electrically connected to the device on a top surface of a first wafer, the first wafer being a device substrate;
forming a sealing line that comprises a plurality of electroconductive patterns connected to the connecting patterns and a plurality of non-electroconductive patterns, the sealing line forming a side wall to seal a device region of the device substrate;
attaching a second wafer, the second wafer being a cap substrate, to a top surface of the sealing line;
forming a plurality of vias in the second wafer, the vias being respectively connected to the electroconductive patterns of the sealing line; and
separating wafer level packages sealing the device, comprising performing a dicing process along the sealing line.

9. The method of claim 8, wherein the forming the plurality of connecting patterns comprises forming a plurality of lead frames.

10. The method of claim 8, wherein the forming of the sealing line comprises forming the non-electroconductive patterns of benzocyclobutene (BCB), dry film resin (DFR), epoxy, or thermosetting polymer using screen printing or injection through a nozzle.

11. The method of claim 8, wherein the forming of the sealing line comprises forming the electroconductive patterns of electroconductive paste using screen printing or injection through a nozzle.

12. The method of claim 8, wherein the forming of the sealing line comprises forming the electroconductive patterns of metal using physical vapor deposition (PVD).

13. The method of claim 8, wherein the performing the dicing process comprises using a scribe line that penetrates the plurality of vias along the sealing line.

14. The method of claim 8, wherein the forming of the vias comprises:
performing an etch process using a photoresist pattern that exposes a portion in contact with the electroconductive patterns so as to form via holes; and
filling the via holes with metal or electroconductive paste.

15. The method of claim 14, wherein the filling the via holes with the metal comprises filling with the metal using physical vapor deposition (PVD) and planarizing the via using a chemical mechanical polishing (CMP) process.

16. The method of claim 14, wherein the filling the via holes with the electroconductive paste comprises filling with the electroconductive paste using screen printing.

* * * * *